United States Patent [19]

Williams

[11] Patent Number: 5,463,827

[45] Date of Patent: Nov. 7, 1995

[54] DISPLAY DEVICE

[75] Inventor: David G. Williams, Benenden, United Kingdom

[73] Assignee: Hanover Displays Limited, East Essex, United Kingdom

[21] Appl. No.: 138,124

[22] Filed: Oct. 15, 1993

[30] Foreign Application Priority Data

Oct. 22, 1992 [GB] United Kingdom ............... 9222165

[51] Int. Cl.⁶ .................................................... G09F 9/00
[52] U.S. Cl. ............................................. 40/449; 40/593
[58] Field of Search ........................... 40/449, 452, 591, 40/593, 643, 644

[56] References Cited

U.S. PATENT DOCUMENTS

| | | | |
|---|---|---|---|
| 3,533,178 | 10/1970 | Strohmaier | 40/643 |
| 3,942,274 | 3/1976 | Winrow. | |
| 3,947,984 | 4/1976 | Winrow. | |
| 4,184,276 | 1/1980 | Hernandez | 40/644 |
| 5,162,696 | 11/1992 | Goodrich | 40/544 X |

FOREIGN PATENT DOCUMENTS

| | | | |
|---|---|---|---|
| 0367851 | 5/1990 | European Pat. Off. . | |
| 01014380 | 10/1964 | United Kingdom . | |
| 1468322 | 4/1975 | United Kingdom . | |
| 2135650 | 9/1984 | United Kingdom | 40/643 |

OTHER PUBLICATIONS

Feinwerktechnik & Messtechnik, vol. 94, No. 2, Mar. 1986, Munchen, pp. 105–108, R. Ludes et al. *Magnetwerkstoffe im Feingeratbau–AM Beispiel Von Matrix–Gro Anzeige–System p. 107; FIG. 6; 7*.

Primary Examiner—Brian K. Green
Attorney, Agent, or Firm—Howson & Howson

[57] ABSTRACT

A display device comprising a frame which is flexible along its length carrying at least one circuit board which can be flexed and which has electric circuit means for magnetically controlling electromagnetic display elements. By deliberately designing the frame so as to resiliently flex along its length, the display device can be resiliently flexed to conform to a curved transparent fronting screen, e.g. a vehicle windscreen.

8 Claims, 2 Drawing Sheets

DISPLAY DEVICE

BACKGROUND OF THE INVENTION

This invention relates to a display device of the kind comprising a frame having a length and a width and, mounted on the frame, at least one circuit board which is capable of being flexed and which is provided with electric circuit means for magnetically controlling the positions of movable electromagnetically controllable display elements having at least two display surfaces respectively of different appearance, the display elements being mounted in a lengthwise and widthwise extending array on the frame. In particular, the display device is intended to be positioned against a transparent fronting screen, e.g. a fixed windscreen or display screen of a bus or other vehicle.

In a known display screen of the kind referred to, the main purpose of the frame is to provide a rigid support for the at least one circuit board so that the latter are not subjected to varying stresses prior to the display device being mounted in its final mounted position. Thus, in such known display devices, the frame is deliberately constructed as a rigid structure carrying the at least one circuit board. Normally the rigid frame supports the at least one circuit board in a common plane. However, if the display device is to be positioned behind a curved screen, e.g. a curved windscreen of a bus, the frame may be deliberately curved to support a number of circuit boards in a curvilinear configuration.

It is also known from U.S. Pat. No. 3,947,984 to deliberately flex a circuit board and to mount the circuit board on a frame in its flexed condition. However, the purpose of flexing the circuit board is to curve the board so as to create a channel effect which resists bending or distortion about lines transverse to the direction about which curvature of the circuit board takes place.

Conventionally different models of buses, although possibly having approximately the same width, have differently configured windscreens. The windscreens may be planar but, more usually, are curved, the curvature of each windscreen normally being greater at its two sides than in the central portion. Although it is possible to mount a standard display device having its array of display elements arranged in a common plane behind a number of differently configured windscreens, this is not ideal since the front of the display device will normally be spaced from the windscreen at least along part of the length of the display device. If the front of the display device does not closely conform to the windscreen the visibility from the front of the display device will be affected. Although this problem can be overcome by curving the frame as previously described to the configuration of the windscreen with which the display device is to be used, such a solution is not ideal since a number of different display device configurations have to be manufactured for use with the different windscreen configurations.

SUMMARY OF THE INVENTION

An object of the present invention is to provide a display device which is able to be flexed along its length so as to conform with a range of differently shaped transparent fronting screens.

According to the present invention there is provided a display device comprising a frame having a length and a width and, mounted on the frame, at least one circuit board which is capable of being flexed and which is provided with electic circuit means for magnetically controlling the positions of movable electromagnetically controllable display elements having at least two display surfaces respectively of different appearance, the display elements being mounted in a lengthwise and widthwise extending array on the frame, wherein the frame is adapted to flex more readily along its length than in the widthwise direction whereby the frame and supported circuit board(s) can be made to conform at least substantially to a range of differently shaped transparent fronting screens.

In contrast with previously known display devices, the frame supporting the at least one circuit board is deliberately designed to be able to flex along its length. Conventional printed circuit boards have a degree of resilient flexibility and are able to flex a certain amount without damage to accommodate flexing of the frame. The display device is therefore able to resiliently flex along its length to conform at least substantially to differently shaped, e.g. differently curved, transparent fronting screens, e.g. vehicle windscreens.

Conveniently the frame comprises at least two elongate supporting means spaced apart in the widthwise direction of the frame and joined together at their adjacent ends. In this case, the or each circuit board is fixed to the, or a widthwise adjacent, pair of said elongate supporting means. Preferably each elongate supporting means comprises at least one elongate member of strip form having a comparatively large width compared with its thickness. In this case, the supporting means is flexible throughout its length. Alternatively, however, it is possible for each supporting means to comprise a number of rigid elements pivotally connected together to provide flexibility along the length of the supporting means.

In the case where each supporting member is of strip form, each supporting member is preferably made of metallic material, e.g. stainless steel typically having a thickness of 2 mm and a width of 50 mm.

Conveniently the frame is provided with a peripheral seal for sealing the frame against a transparent fronting screen behind which the display device is intended to be mounted. In this case, the display device is not intended to be provided with its own transparent fronting screen. Instead, the fronting screen of the apparatus behind which the display device is intended to be used provides the fronting screen for the display device. The resilient seal suitably comprises a rubber seal, for example of the kind used in the vehicle industry for sealing vehicle doors and the like.

BRIEF DESCRIPTION OF THE DRAWINGS

An embodiment of the invention will now be described by way of example with particular reference to the accompanying drawings in which.

DESCRIPTION OF THE PREFERRED EMBODIMENTS

Figure 1:
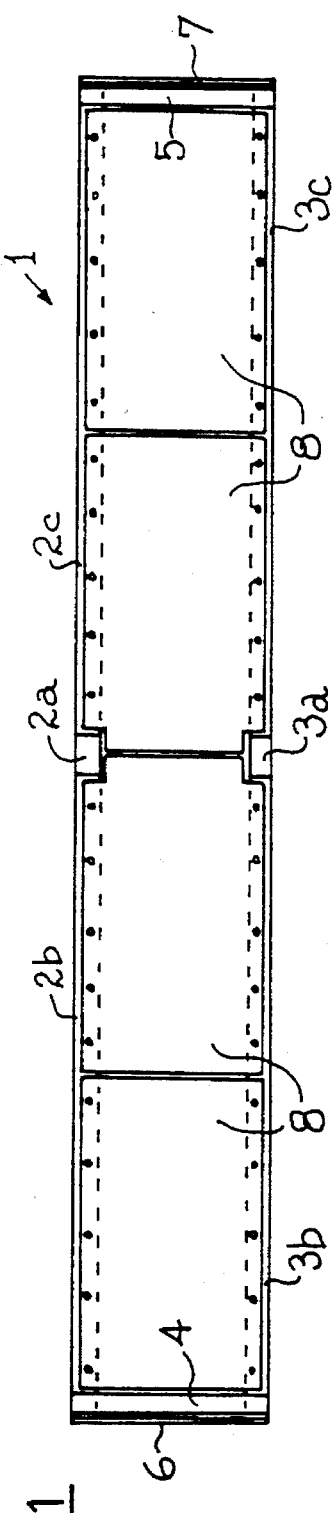
FIG. 1 is a view from the rear of a display device according to the invention having a front display surface disposed in a generally planar configuration.
Figure 2:
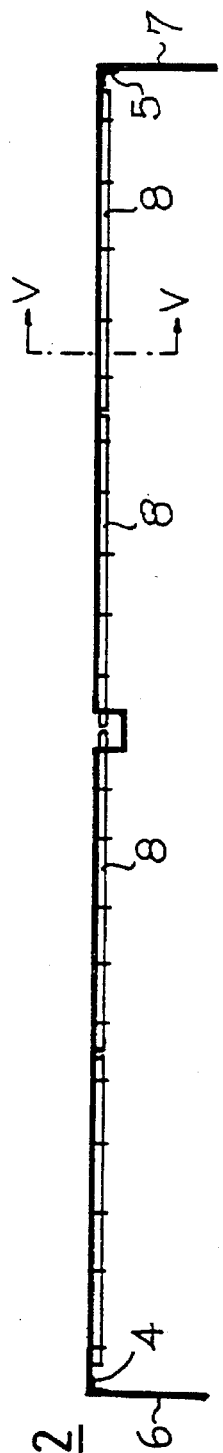
FIG. 2 is a view from above of the display device shown in FIG. 1.

FIGS. 1 and 2 show an elongate frame generally designated by reference numeral 1 having top and bottom structural supports 2 and 3 joined together at their ends by rigid angle bars 4 and 5. Side plates 6 and 7 are joined to the angle bars 4 and 5, respectively. Each of the top and bottom structural supports is made of strip material, e.g. flat, rectangular section stainless steel typically having a width of 50 mm and a thickness of 2 mm, which is able to resiliently flex along its length but is substantially inflexible or rigid in its widthwise direction. As shown, each structural support comprises a central channel-shaped portion 2a (3a) to which are rivetted resiliently flexible end portions 2b and 2c (3b and 3c).

Figure 4:
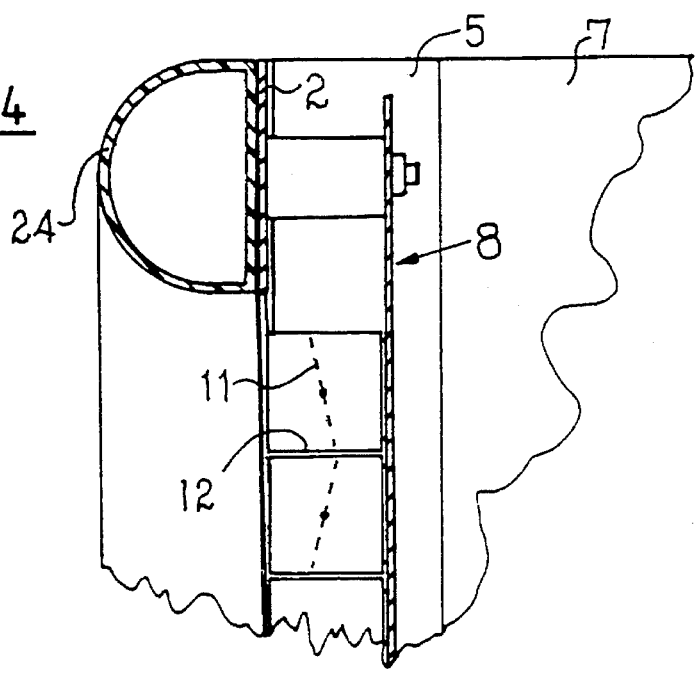
FIG. 4 is a section on an enlarged scale taken on the line V—V of FIG. 2.
Figure 5:
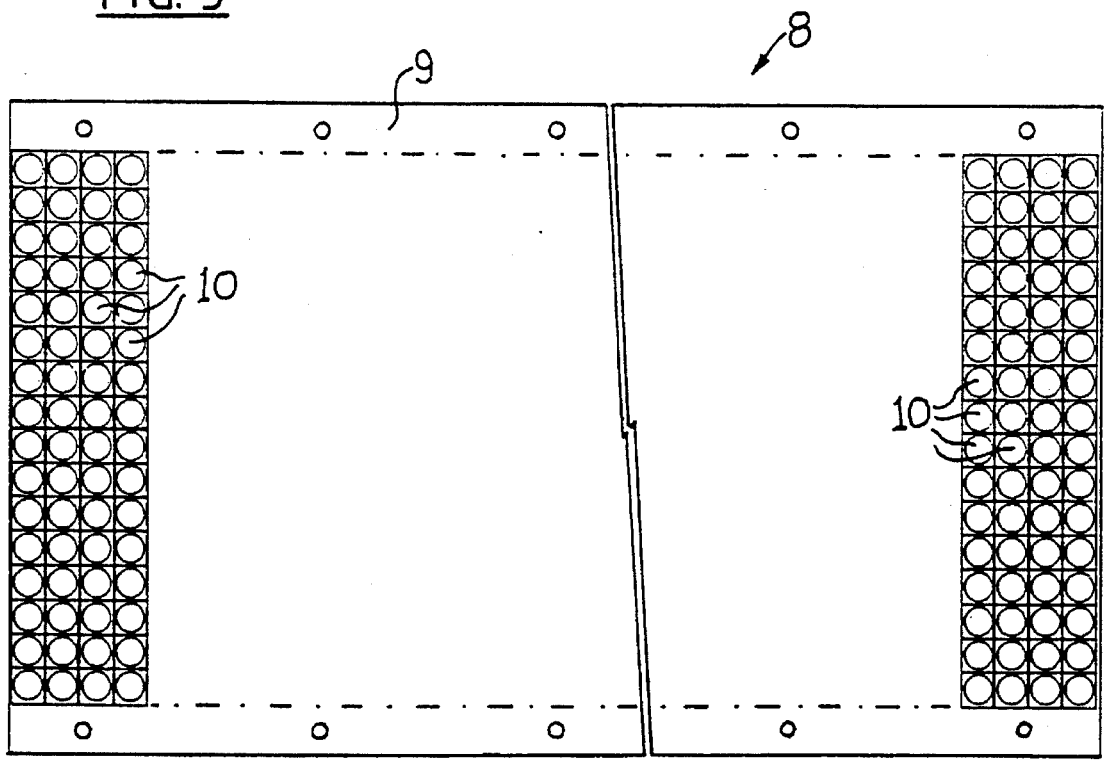
FIG. 5 is a view from the front of a circuit board carrying an array of electromagnetically controllable display elements.

The top and bottom structural supports 2 and 3 are spaced apart in the widthwise direction parallel to each other and have display boards 8 (see FIGS. 4 and 5) bolted thereto. Each display board 8 comprises a printed circuit board 9 of conventional construction and typically of 1/16 inch thickness made of epoxy and fiberglass or polyester and fiberglass. Mounted on the front of the circuit board 9 are a plurality of magnetically controllable display elements 10 arranged in an array. Magnetically controllable display elements are well known and typically comprise a circular display disc 11 having different, e.g. contrasting, display surfaces and which are pivotally mounted in a display housing 12. Each display housing 12 may house a separate display disc 11 or a plurality of display discs, e.g. 7 or 8 display discs arranged in a line. An example of a display disc mounted in a single housing is shown in UK patent specification GB-A-1014380 and an example of seven display discs arranged in a common housing strip is shown in UK patent specification GB-A-1468322. In each case, each display disc carries a permanent magnet defining a magnetic axis at an angle to the pivoting axis of the display disc and means for creating the magnetic field of predetermined polarity for pivoting the display disc into a desired orientation to display one or the other of its display surfaces. Such magnetically controllable display elements are well known in the art and the present invention is not limited to any particular type of magnetically controllable display element although it is at present preferred for a number of display elements 10 to be arranged in a strip housing, e.g. of the type shown in GB-A-1468322. To assist flexing of each display board 8, such strip housings are preferably arranged to extend in the widthwise direction of the frame 1 so that adjacent strip housings, which are not joined together, are merely moved apart and not individually flexed, on flexing of the printed circuit board 9 in the elongate direction of the frame.

The back of each printed circuit board 9 has electrical connections for connecting the display elements 10 to electric control means (not shown), e.g. microprocessors and the like, for individually controlling each of the display elements.

Such display boards 8 are already known in the art. As previously stated, the printed circuit boards 9 have a degree of resilient flexibility although heretofore it has been considered desirable for the boards 9 to be rigidly mounted on a rigid, substantially inflexible supporting frame to prevent the printed circuit boards from flexing. In contrast, the present invention deliberately seeks to mount the printed circuit boards 9 on a resiliently flexible frame 1 so that the frame can be shaped along its length to conform to curved surfaces, e.g. a curved windscreen of a bus.

Figure 3:
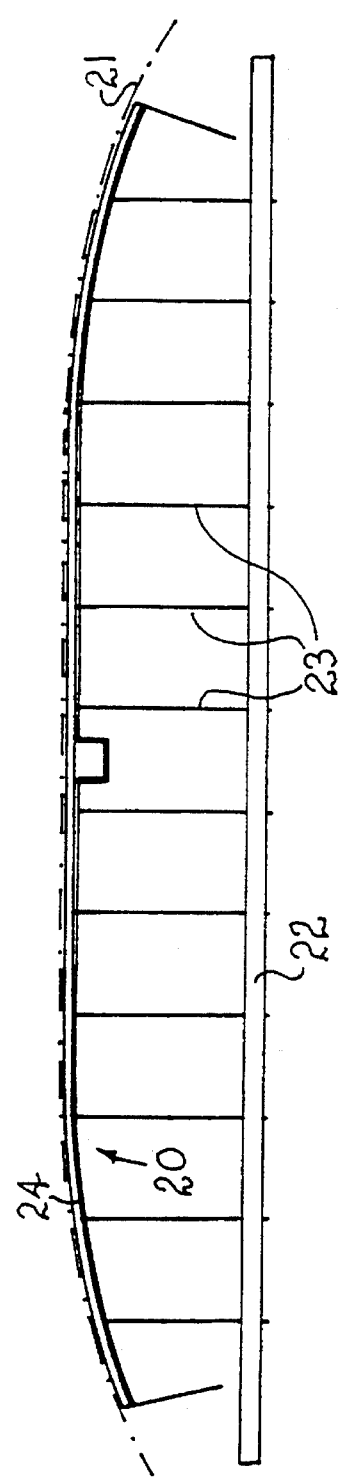
FIG. 3 is a view from above schematically showing the display device shown in FIGS. 1 and 2 configured against a curved transparent fronting screen.

FIG. 3 shows the display device 20, typically about 2 m in length, mounted behind a curved windscreen (shown in chain lines) of a vehicle. A rigid elongate bar 22 is mounted internally within the vehicle spaced a distance from the windscreen 21. The display device 20 is mounted between the windscreen 21 and bar 22 and is held in place by a plurality of adjustable screw threaded members 23 shown schematically in FIG. 3. The screw threaded members 23 are adjusted so that the frame 1 flexes and at least substantially adopts the curved configuration of the windscreen 21. This is made possible by the supports 6,7, which are in strip form, typically 2 mm thick and 50 mm wide, being resiliently flexible along their lengths and yet providing rigidity in the widthwise direction. A resilient seal 24 (not shown in FIGS. 1 and 2 and but shown in FIGS. 3 and 4) which is secured around the front periphery of the frame 1 is pressed against the windscreen 21 to provide a seal for preventing the ingress of dust and dirt. Because of the inherent resilient flexibility of the frame 1 and display boards 8, including the circuit boards 9, the frame and circuit boards are able to conform closely to the configuration of the windscreen 21.

Although not shown, the display device 20 would in practice be provided with top, bottom and rear covers to conceal the rear of the display boards 8. To accommodate flexing of the frame 1, these top, bottom and rear covers may have a concertina construction or may comprise overlapping separately movable cover parts.

The channel shaped central portions 2a and 3a are intended to hold a light (not shown), e.g. a flexible elongate light, for illuminating the front of the display board. However this is not essential and the top and bottom supports 2 and 3 may take other forms. For example each support 2 and 3 may comprise a single, flat rail or strip, e.g. of steel, such as stainless steel, which can be resiliently flexed along its length and which has no shaped central portion. Instead of the supports being flexible all along their length, they could be formed of rigid components pivotally secured together so as to be able to flex along their lengths.

Throughout this specification reference is made to the "width" of the frame and the "widthwise" direction. In normal usage where the display device extends, in the lengthwise direction of the frame, generally horizontally, the "width" of the frame will be its height.

The foregoing detailed description has been given for clearness of understanding only and no unnecessary limitations should be understood therefrom as some modifications will be obvious to those skilled in the art without departing from the scope and spirit of the appended claims.

What is claimed is:

1. A display device comprising a frame having a length and a width, a circuit board mounted on the frame and capable of being flexed, the circuit board having a front side and a rear side, the direction from the front side to the rear side of the circuit board being transverse to the length and width of the frame, movable electromagnetically controllable display elements arranged at the front side of the circuit board in a flexible array which extends in lengthwise and widthwise directions relative to the frame, each display element having at least two display surfaces respectively of different appearances, and electric circuit means provided on the circuit board for magnetically moving said display elements to present said surfaces selectively for display, wherein the frame is elongated in the direction of its length, and composed of lengthwise structural elements and widthwise structural elements, the lengthwise structural elements being more flexible than the widthwise structural elements, whereby the frame is able to flex more readily about an imaginary widthwise line than about an imaginary lengthwise line and the frame and the circuit board mounted thereon can be flexed to conform at least substantially to a range of differently shaped transparent fronting screens.

2. A display device according to claim 1, in which the frame comprises at least two elongate supporting members extending lengthwise of the frame and spaced apart from each other in the direction of the width of the frame, each of the two elongate supporting members having first and second ends, the first ends of each of said elongate supporting members being adjacent to each other and joined together and the second ends of each of said elongate supporting members also being adjacent to each other and joined together.

3. A display device according to claim 2, in which said circuit board is fixed to said elongate supporting members.

4. A display device according to claim 2, in which each of said elongate supporting members is in the form of a strip having a width in the direction of said width of the frame and a thickness in said direction transverse to the length and width of the frame, the width of each of said elongate supporting members being large compared with its thickness and both of said elongate supporting members being flexible throughout their lengths.

5. A display device according to claim 4, in which each of said elongate supporting members is made of metallic material.

6. A display device according to claim 2, in which the frame comprises rigid connecting elements, and in which the said spaced apart elongate supporting members are joined together by said rigid connecting elements.

7. A display device according to claim 1, in which the frame is provided with means, comprising a peripheral resilient seal, for sealing the frame against a transparent fronting screen behind which the display device is intended to be mounted.

8. A display device according to claim 1 in combination with a vehicle having a curved, transparent fronting screen the display device being mounted behind the fronting screen and curved along its length to conform to the curvature of the fronting screen.

* * * * *

UNITED STATES PATENT AND TRADEMARK OFFICE
CERTIFICATE OF CORRECTION

PATENT NO. : 5,463,827

DATED : November 7, 1995

INVENTOR(S) : David G. Williams

It is certified that error appears in the above-identified patent and that said Letters Patent is hereby corrected as shown below:

On the cover page, after the name of assignee "Hanover Displays Limited," change "East Essex" to "East Sussex".

Signed and Sealed this

Thirtieth Day of April, 1996

Attest:

BRUCE LEHMAN

Attesting Officer    Commissioner of Patents and Trademarks